United States Patent
Sekine et al.

(10) Patent No.: US 8,079,131 B2
(45) Date of Patent: Dec. 20, 2011

(54) METHOD FOR FILLING METAL INTO FINE SPACE

(75) Inventors: Shigenobu Sekine, Katsushika-Ku (JP); Yurina Sekine, Katsushika-Ku (JP); Ryuji Kimura, Katsushika-Ku (JP)

(73) Assignee: Napra Co., Ltd., Tokyo (JP)

( * ) Notice: Subject to any disclaimer, the term of this patent is extended or adjusted under 35 U.S.C. 154(b) by 0 days.

(21) Appl. No.: 12/394,774

(22) Filed: Feb. 27, 2009

(65) Prior Publication Data

US 2010/0126688 A1    May 27, 2010

(30) Foreign Application Priority Data

Nov. 26, 2008 (JP) ................................. 2008-300887

(51) Int. Cl.
B23P 25/00 (2006.01)

(52) U.S. Cl. .................. 29/527.5; 29/527.1; 29/527.2; 29/527.3; 29/527.7; 29/530; 164/7.1; 164/34; 164/61; 164/113; 228/221; 228/227; 228/245; 228/246

(58) Field of Classification Search .................. 29/458, 29/527.2, 527.3, 527.5, 527.7, 530, 842, 29/844, 852; 164/34, 7.1, 61, 62, 65, 98, 164/113, 119, 120; 228/221, 227, 245, 246, 228/256–258

See application file for complete search history.

(56) References Cited

U.S. PATENT DOCUMENTS

| | | | | |
|---|---|---|---|---|
| 5,908,065 A * | 6/1999 | Chadwick | ................ | 164/120 |
| 6,178,093 B1 * | 1/2001 | Bhatt et al. | ................ | 361/795 |
| 6,516,862 B2 * | 2/2003 | Klein | ................ | 164/4.1 |
| 6,620,264 B2 * | 9/2003 | Kundig et al. | ................ | 148/538 |
| 6,764,748 B1 * | 7/2004 | Farquhar et al. | ................ | 428/209 |
| 7,217,890 B2 * | 5/2007 | Suemasu et al. | ................ | 174/264 |
| 7,814,651 B2 * | 10/2010 | Suemasu et al. | ................ | 29/852 |
| 2005/0147522 A1 * | 7/2005 | Watanabe et al. | ................ | 420/555 |

FOREIGN PATENT DOCUMENTS

| | | |
|---|---|---|
| JP | 2-213471 | 8/1990 |
| JP | 3-225829 | 10/1991 |
| JP | 07-142283 | 6/1995 |
| JP | 11-298138 | 10/1999 |
| JP | 2000-111896 | 4/2000 |
| JP | 2000-228410 | 8/2000 |

(Continued)

OTHER PUBLICATIONS

Office Action issued Dec. 27, 2010, in Taiwan Patent Application No. 098116527 (with English translation).

Primary Examiner — David Bryant
Assistant Examiner — Bayan Salone
(74) Attorney, Agent, or Firm — Oblon, Spivak, McClelland, Maier & Neustadt, L.L.P.

(57) ABSTRACT

The present invention includes a step of cooling a molten metal within a fine space present in the inside of an object and hardening it while applying a forced external force exceeding atmospheric pressure to the molten metal. The fine space is opened on the outer surface of the object in terms of one end thereof. The forced external force is given by at least one member selected among a pressing pressure, an injection pressure and a rolling compaction and applied to the molten metal from the opening surface side on which the fine space is opened, in a state that the other end side of the fine space is closed.

12 Claims, 4 Drawing Sheets

FOREIGN PATENT DOCUMENTS

| | | |
|---|---|---|
| JP | 2001-053218 | 2/2001 |
| JP | 2002-158191 | 5/2002 |
| JP | 2002-237468 | 8/2002 |
| JP | 2002-368082 | 12/2002 |
| JP | 2002368082 A * | 12/2002 |
| JP | 2003-168859 | 6/2003 |
| JP | 2003-257891 | 9/2003 |
| JP | 2003-273155 | 9/2003 |
| JP | 2004-128042 | 4/2004 |
| JP | 2004-241479 | 8/2004 |
| JP | 2005-059061 | 3/2005 |
| JP | 2005-064451 | 3/2005 |
| JP | 2005-109515 | 4/2005 |
| JP | 2005-116863 | 4/2005 |
| JP | 2005-123240 | 5/2005 |
| JP | 2005-123250 | 5/2005 |
| JP | 2005-183548 | 7/2005 |
| JP | 2006-032695 | 2/2006 |
| JP | 2006-179711 | 7/2006 |
| JP | 2006-203170 | 8/2006 |
| JP | 2007-096226 | 4/2007 |
| JP | 2007-096232 | 4/2007 |
| JP | 2007-250867 | 9/2007 |
| JP | 2008-053429 | 6/2008 |

\* cited by examiner (A)

(B)

(A)

(B)

(A)

(B)

METHOD FOR FILLING METAL INTO FINE SPACE

TECHNICAL FIELD

The present invention relates to a method for filling a molten metal in a fine space present in an object to be treated and hardening it.

BACKGROUND OF THE INVENTION

For example, in electronic devices represented by semiconductor devices, micromachines and so on, there may be the case where a fine conductor-filled structure, a joint structure or a functional structure each having a high aspect ratio in the inside thereof must be formed. In such case, there are known technologies for realizing a conductor-filled structure, a joint structure, a functional structure, etc. by filling a previously chosen filler in a fine space. However, it is extremely difficult to thoroughly fill a filler in a fine space having a high aspect ratio to an extent of its bottom without forming an air gap or deformation after hardening.

For example, when the case of a wafer treatment to be used for the manufacture of a semiconductor device is taken as an example, a number of fine spaces (holes) for the purpose of forming an electrode or the like are provided in a wafer, and the fine spaces have a very small hole size of, for example, not more than several ten Am. Moreover, there is frequently found the case where the thickness of the wafer is considerably thick relative to such a fine space having a fine hole size, and the aspect ratio of the fine space is 3 or more. In order to form an electrode, a conductive material must be surely filled in such a fine space having a high aspect ratio to an extent that it reaches its bottom. Accordingly, a high-degree filling technology is naturally required.

As the technology for forming an electrode, there is also known a technology of using a conductive paste composed of a mixture of a conductive metal component and an organic binder. However, a metallurgical technology using a molten metal material which is excellent in conductivity, low in loss and excellent in high-frequency characteristics attracts attention. Such a technology is disclosed in, for example, JP-A-2002-237468 and JP-A-2002-368082.

First of all, JP-A-2002-237468 discloses a technology for filling a metal in a fine space (through hole) by a molten metal backfilling process. The molten metal backfilling process as referred to herein is a process in which an atmosphere where an object (wafer) is placed is subjected to pressure reduction; the object is subsequently inserted into a molten metal while keeping the reduced pressure state; the ambient gas pressure of the molten metal is subsequently raised, thereby filling the molten metal in the space due to a difference in the ambient gas pressure before and after the insertion of a metal; and the object is subsequently lifted up from a molten metal tank and cooled in the air.

However, this molten metal backfilling process involves the following problems.

(a) When the object is lifted up from the molten metal tank and cooled, the metal surface becomes hollow in a concave state to a position which is lower than the surface of the object. For that reason, there is a concern that electrical conduction with the outside becomes incomplete.

(b) In order to solve the foregoing problem, a molten metal must be again supplied for the purpose of filling the concavity. Moreover, in order to fill the concavity, it is necessary to protrude the surface of the supplied metal higher than the surface of the object. Accordingly, a step of making the surface of the metal conform with the surface of the object, for example, a CMP (chemical mechanical polishing) step, is necessary. Such becomes a factor to cause complication of the steps and a reduction of the yield following this and so on.

(c) A further serious problem is the fact that nevertheless the foregoing complicated steps are necessary, an air gap in which the molten metal is insufficiently filled or the like is formed in the fine space, especially its bottom.

Next, JP-A-2002-368082 discloses a differential pressure filling system. In this differential pressure filling system, after disposing an object having a fine space formed therein and a metal sheet within a vacuum chamber, the pressure within the vacuum chamber is reduced, the metal sheet is melted by a heating unit, and the pressure within the vacuum chamber is subsequently raised with an inter gas to atmospheric pressure or higher. As a result, the molten metal is sucked in vacuo into the fine space. Subsequently, the vacuum chamber is opened, and the metal in a molten state, which remains on the surface of a specimen, is removed, and residue is then cooled at room temperature in the air.

According to JP-A-2002-368082, it is described that since the heat capacity of the molten metal is lower than that of the molten metal backfilling process (see JP-A-2002-237468), and therefore, there are brought such effects that warpage or cracking is not formed in a specimen; that a surplus metal can be suppressed to the minimum; and that it is possible to devise the realization of a reduction in costs.

However, according to the differential pressure filling system disclosed in JP-A-2002-368082, the molten metal cannot be completely filled to the bottom of the fine space, and an air gap is formed in the inside of the fine space.

Also, since the metal in a molten state, which remains on the surface of a specimen, is removed, a part (upper end side) of the molten metal filled in the fine gap is also scraped away in that step. For that reason, the problem on the concavity still exists.

Actually, what neither wafer to be manufactured by the differential pressure filling system nor device using the same has been provided on the market is an evidence that the foregoing problem cannot be solved.

Technical difficulty generated during thoroughly filling a molten metal in a fine space is not always problematic limitedly to the case of a wafer treatment for use in semiconductor device. This can also become problematic in other electronic devices, micromachines and the like.

SUMMARY OF THE INVENTION

An object of the present invention is to provide a method for filling a fine space with a metallic filler without causing concaveness or forming an air gap, a void, etc.

Another object of the present invention is to provide a method which is free from resupply of a molten metal after cooling, a CMP step, etc. and which is able to contribute to simplification of steps, enhancement of a yield, etc.

In order to achieve at least one of the foregoing objects, the present invention includes a step in which, in filling a molten metal in a fine space present in an object which is objective to the treatment and hardening it, the molten metal is cooled and hardened while applying a forced external force to the molten metal within the fine space.

As described previously, since the method according to the present invention includes a step of cooling a molten metal and hardening it while applying a forced external force to the molten metal in a fine space, not only the molten metal can be thoroughly filled to an extent of the bottom of the fine space by the forced external force to be applied from the outside, but deformation of the metal to be caused due to heat shrinkage can be suppressed. For that reason, it is possible to fill the fine space with a metal body without forming an air gap or a void or the like.

For the same reason, the concaveness of the molten metal which is caused during cooling in a fine gap can also be avoided. For that reason, electrical conduction with the outside can be surely secured.

Furthermore, since the concaveness of the metal body can be avoided, the present invention is free from resupply of a molten metal after cooling, a CMP step, etc. and is able to contribute to simplification of steps, enhancement of a yield, etc.

The forced external force as referred to in the present invention means the fact that it does not include a pressure applied when allowed to spontaneously stand, typically atmospheric pressure. This forced external force is given by at least one member selected among a pressure, a magnetic force and a centrifugal force. The foregoing pressure may be given by a positive pressure or may be given by a negative pressure. In the case of a negative pressure, the pressure is a sucking force. The foregoing pressure is specifically given by a pressing pressure or a gas pressure.

Another form of the forced external force includes a form utilizing an injection pressure by an injection machine. In that case, a molten metal is supplied onto the opening surface of an object by an injection machine, and the molten metal is cooled and hardened while applying a forced external force by its injection pressure.

In the case of applying a forced external force, it is preferable that in an initial stage of the hardening step, by positively utilizing a dynamic pressure as well as a static pressure, a dynamic pushing operation by the dynamic pressure is conducted. According to this method, it is possible to make the molten metal arrive surely at the bottom of a fine space, thereby more surely avoiding the formation of an unfilled region in the bottom.

In the present invention, at least a part of the steps is carried out in a reduced pressure atmosphere within a vacuum chamber. This is because the molten metal can be sucked in vacuo into a fine space due to the reduced pressure atmosphere within the vacuum chamber. The reduced pressure atmosphere as referred to herein refers to an atmosphere the pressure of which is lower than the atmospheric pressure as a reference.

The molten metal is preferably supplied such that a metal thin film is formed on the opening surface. As a result, the molten metal can be surely pushed into the inside of the fine space by the forced external force which the metal thin film receives.

In the case where the molten metal is supplied such that its metal thin film is formed on the opening surface, a step in which, after hardening the molten metal, the metal thin film on the opening surface is remelted, and the remelted metal thin film is wiped off can be taken. The heat at the time of remelting is also applied to the hardened metal body within the fine gap, but the heat capacity of the hardened metal body is remarkably larger than the heat capacity of the metal thin film. Accordingly, even when the metal thin film is remelted, the development of remelting of the hardened metal body does not occur. For that reason, a flat surface which does not have a concave can be formed by wiping off only the metal thin film.

The other objects, constructions and advantages of the present invention will be further detailed below with reference to the attached drawings. However, the attached drawings show only illustrative examples.

DESCRIPTION OF THE PREFERRED EMBODIMENTS

Figure 1:
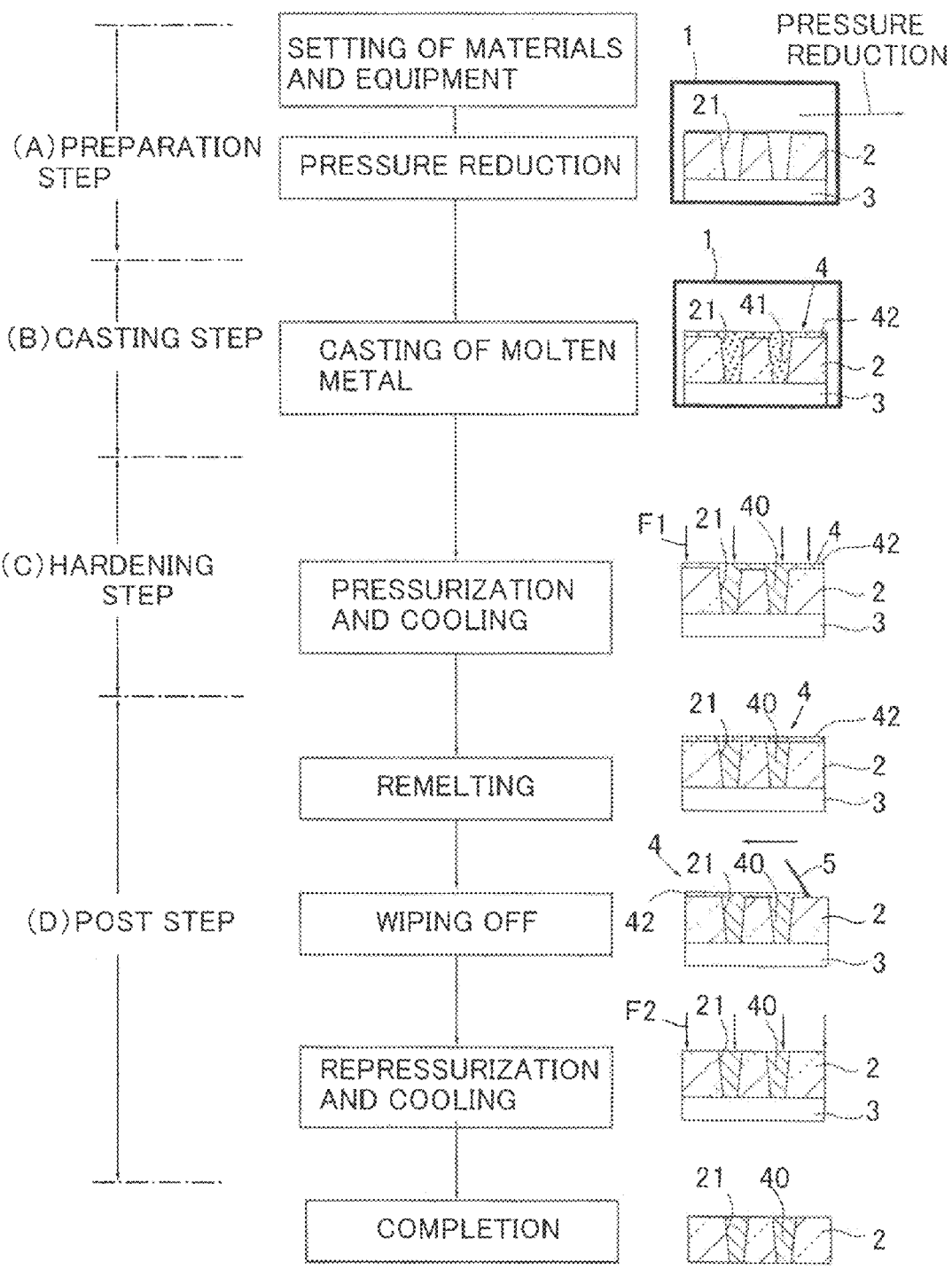
FIG. 1 is a flow chart showing a method according to the present invention.

Referring to FIG. 1, a method shown in this embodiment includes a preparation step, a casting step, a hardening step and a post step. Indeed, the distinction of these steps is merely a distinction for the sake of convenience of explanation. These steps are hereunder described in order.

(A) Preparation Step:

First of all, an object 2 which is objective to the treatment is set on a support tool 3 provided in the inside of a vacuum chamber 1. The object 2 has a fine space 21. Though the fine space 21 is required to be opened toward the outer surface of the object 2, its shape, passage and number and the like are arbitrary. Though the fine space 21 is not necessarily a through hole as illustrated but may be a non-through hole. Alternatively, the fine space 21 is not limited to one in a vertical direction as illustrated but may be in a complicated shape such that it is connected in a horizontal direction orthogonal to the former. The fine space 21 is not limited to an intentionally formed one but may be one generated without being intended.

Though a representative example of the object 2 is a wafer for use in semiconductor device, it should not be construed that the object 2 is limited thereto. The present invention is widely applicable to the case where it is necessary to fill a molten metal in the fine space 21 present in the object 2 and harden it and can be widely applied to the case of forming a fine conductor-filled structure, a joint structure or a functional portion in the inside thereof in, for example, other electronic devices or micromachines, etc. In some case, the present invention can also be applied to devices having a usual size other than electronic devices and micromachines.

Also, with respect to the object 2, metals, alloys, metal oxides, ceramics, glasses, plastics or complex materials thereof, or stacks thereof can be widely used without limitations so far as they has heat resistance against the heat radiated from the molten metal. Furthermore, the external shape of the object 2 is not limited to a tabular form but can take an arbitrary shape. The illustrated tabular form is merely one example chosen for the sake of convenience of explanation.

In the case where a wafer is chosen as the object 2, its physical properties and structure and the like vary depending upon the kind of a device which is objective. For example, in the case of a semiconductor device, an Si wafer, an SiC wafer, an SOI wafer and so on are useful. In the case of a passive electronic circuit device, there may be the case where the object 2 takes a form of a dielectric material, a magnetic material or a complex thereof. In the manufacture of MRAM (magnetoresistive random access memory), MEMS (micro electro mechanical systems), optical device and so on, a wafer having physical properties and structure capable of meeting those requirements is useful. In the wafer, the fine space 21 is in general called a through hole, a non-through hole (blind hole) or a via hole. This fine space 21 is, for example, not more than 60 μm in terms of a hole size. The thickness of the wafer itself is usually several ten μm. Consequently, the fine space 21 has a considerably high aspect ratio. This is a significant reason why a problem is caused during filling a molten metal 4 in the fine space 21.

Subsequently, the vacuum chamber 1 is evacuated, thereby reducing the internal pressure of the vacuum chamber 1 to, for example, about $10^{-3}$ Pa in terms of a degree of vacuum. Indeed, this degree of vacuum is merely an example, but it should not be construed that the degree of vacuum is limited thereto.

(B) Casting Step:

Subsequently, in the casting step, the molten metal 4 is cast into the fine space 21 from the opening surface on which the fine space 21 is opened. This casting step is made on a basis of the matter that it is carried out in a reduced pressure atmosphere within the vacuum chamber 1. As a result, the molten metal 4 is sucked in vacuo into the fine space 21, and a filled molten metal 41 is formed in the inside of the fine space 21.

With respect to the metal material constituting the molten metal 4, its composition component is chosen depending upon the kind of the object 2 and its purpose. In general, the molten metal 4 is not constituted of a single metal element but contains plural metal elements on the assumption of alloying. For example, when the object 2 is a semiconductor wafer, and it is aimed to form a conductor in the inside of the fine space 21, a metal component including at least one metal element selected from the group consisting of Ag, Cu, Au, Pt, Pd, Ir, Al, Ni, Sn, In, Bi and Zn can be used. In the case of obtaining a joint structure, a metal component is chosen while taking into account joining characteristics with the object to be joined.

The foregoing metal component preferably has a nano-composite structure. The nano-composite structure as referred to herein refers to a polycrystal having a particle size of not more than 500 nm. An advantage to be brought by the use of a metal component having a nano-composite structure resides in a point of lowering a melting point of the molten metal 4 as a whole.

Another method for lowering the melting point is to combine a high-melting metal component (for example, Ag, Cu, Au, Pt, Pd, Ir, Al or Ni) with a low-melting metal component (for example, Sn, In or Bi).

It is preferred to incorporate bismuth (Bi) into the molten metal material. An advantage to be brought by the incorporation of bismuth (Bi) resides in a point that it is able to contribute to the formation of a metallic conductor which is free from an air gap and a void within the fine space 21 utilizing volume expansion characteristics of bismuth (Bi) at the time of cooling.

Furthermore, in the case where the bottom of the fine space 21 is closed by a conductor, it is also effective to take a step of supplying a noble metal nano particle into the fine space 21 before casting the molten metal 4 and thereafter casting the molten metal 4. By undergoing this step, it is possible to reduce an oxide film which may possibly be formed on a conductor due to a catalytic action of the noble metal nano particle, thereby forming joining with low electrical resistance between the molten metal 4 and the conductor. The noble metal includes gold (Au), silver (Ag), platinum (Pt), palladium (Pd), rhodium (Rh), iridium (Ir), ruthenium (Ru) and osmium (Os). Of these elements, at least one member selected among gold (Au), platinum (Pt) and palladium (Pd) is preferably incorporated.

In casting the molten metal 4, the foregoing metal material is previously melted outside the vacuum chamber 1 and then supplied into the object 2 in the inside of the vacuum chamber 1. Alternatively, a heating mechanism is attached to the support tool 3 set in the inside of the vacuum chamber 1, thereby melting the metal material within the vacuum chamber 1. The temperature for melting can be set up at the range of from 200 to 300° C. although it is merely one example. As described previously, the melting temperature can be adjusted or decreased by selection of a combination of metal components and nanofabrication.

The metal material may be supplied in a form of powder. Alternatively, a metal thin plate corresponding to the outer shape of the object 2 may be previously prepared using the foregoing metal material, and this metal thin plate is superimposed on one surface of the object 2 and then melted.

Different from the foregoing casting method, a step of dipping the object 2 in a molten metal tank in a reduced pressure atmosphere and thereafter lifting up it can also be employed.

The casting step can include a step of pressurizing the molten metal 4. In this step, it is preferable that not only a static pressure but a dynamic pressure is given to the molten metal. This is because the molten metal 4 can be forcedly cast into the fine space 21 due to a dynamic pushing action of the dynamic pressure. The pressure may be given as a pressing pressure using a mechanical pressing measure; may be given as a pushing force using a screen and a squeeze; or may be given by raising the ambient gas pressure within the vacuum chamber 1 from the reduced pressure state. So-called differential pressure filling is carried out by a pressure rise from the reduced pressure state.

In the case of raising the gas pressure in the inside of the vacuum chamber 1, it is preferred to supply an inert gas such as an $N_2$ gas into the vacuum chamber 1 and raise its gas pressure while preventing the oxidation of the molten metal material. The gas pressure within the vacuum chamber 1 can be set up at the range of from 0.6 to 1 kgf/cm$^2$ although it is merely one example. An appropriate dynamic pressure can be generated by controlling pressure rise-time characteristics until the pressure reaches this gas pressure.

Furthermore, the casting step can also include a step of injecting the molten metal 4 by an injection machine disposed outside the vacuum chamber 1 to fill it in the fine space 21. This step may be combined with the foregoing pressurizing measure or may be an independent measure thereupon.

In the casting step, it is preferable that the molten metal 4 is supplied onto the opening surface of the object 2 on which the fine space 21 is opened such that a metal thin film 42 is formed. That is, the molten metal 4 is supplied such that the volume of the molten metal 4 is larger than the total volume of the fine space 21. By undergoing such a step, the pushing operation can be surely caused utilizing a dynamic pressure which is applied to the metal thin film 42.

Furthermore, in the casting step, it is also possible to achieve filling utilizing ultrasonic vibration, filling utilizing a magnetic force or filling utilizing a centrifugal force. With respect to the ultrasonic vibration filling, it may be thought to give ultrasonic vibration to the object 2, to give ultrasonic vibration to a pressing unit, or to give ultrasonic vibration to a screen and a squeeze. Indeed, it is necessary to appropriately choose the vibration frequency from the viewpoints of enhancing the vibration efficiency and avoiding an overflow of the molten metal 4 due to a resonance action of the object 2.

The magnetic force filling may be achieved by incorporating a magnetic component into the molten metal 4, applying a magnetic field from the outside and bringing the molten metal 4 into the inside of the fine space 21 while utilizing a magnetic force which acts on the magnetic component. The centrifugal force filling may be achieved by utilizing a centrifugal force generated at the time of revolving the object 2.

(C) Hardening Step:

Subsequently, the process is transferred into a hardening step. The treatment contents in this hardening step are one of significant characteristic features in the present invention. In the hardening step, after casting the molten metal 4 into the fine space 21 by the foregoing casting step, the filled molten metal 41 within the fine space 21 is cooled and hardened in a state that a forced external force F1 exceeding the atmospheric pressure is applied. The forced external force F1 is continuously applied until hardening has been completed. Though cooling is basically gradual cooling at room temperature, a lower temperature condition than room temperature may be set up, or as the case may be, a higher temperature condition than room temperature may be set up. Furthermore, a cooling method of decreasing the temperature continuously or stepwise with a lapse of time may be employed.

The level of the forced external force F1 is determined taking into account the mechanical strength of the object 2, the aspect ratio of the fine space 21 and soon. As one example, in the case where the object 2 is a silicon wafer, it is preferred to set up the forced external force F1 at the range of atmospheric pressure or more and not more than $2\ kgf/cm^2$. In the case where the mechanical strength of the object 2 and the aspect ratio of the fine space 21 are large, a higher pressure can be applied.

The forced external force F1 which is applied in the hardening step is given by at least one member selected among a pressing pressure, an injection pressure, a gas pressure and a rolling compaction. In the case of utilizing such a pressure, in an initial stage of the hardening step, by positively utilizing a dynamic pressure as well as a static pressure, a dynamic pushing operation by the dynamic pressure can be conducted. As a result, the operation can be achieved such that not only the generation of an air gap or a void is more surely suppressed, but the filled molten metal 41 more surely reaches the bottom of the fine space 21. An original intention which lies on the background of applying, as the forced external force, a pressing pressure, an injection pressure, a gas pressure or a rolling compaction resides in the point that the molten metal is cooled and hardened in a closed state without coming into contact with the air or atmosphere. This point is extremely important in the cooling and hardening step of the molten metal from the viewpoint of preventing the oxidation of the metal.

The pressing pressure can be applied by a pressing unit using an air pressure, a pressing unit using an oil pressure or a mechanical pressing unit. The pressing unit of this kind is provided with a slider (pressing plate) which is disposed in the vicinity of the object 2 to directly apply a pressure, and by this slider, the molten metal is cooled and hardened in a closed state without coming into contact with the air or atmosphere.

The injection pressure can be applied by an injection machine. In the case of using an injection machine, the molten metal can be cooled and hardened by its substantial action in a closed state without coming into contact with the air or atmosphere.

The gas pressure can be applied by keeping the object 2 within the vacuum chamber 1 or a treatment chamber prepared separately therefrom and raising its ambient gas pressure. In the case of applying the gas pressure, a pressure receiving/pressing plate which receives the gas pressure to directly apply a pressure to the object is prepared, and the molten metal can be cooled and hardened by this pressure receiving/pressing plate in a closed state without coming into contact with the air or atmosphere. In the gas pressure, by controlling its temporal pressure rise characteristics, in an initial stage of the hardening step, by positively utilizing a dynamic pressure, a dynamic pushing operation by the dynamic pressure can be conducted. In the hardening step, it is also possible to utilize ultrasonic vibration filling, magnetic force filling or centrifugal force filling.

The pressurization by a forced external force in the hardening step may be carried out independently upon the pressurization step in the casting step, or may be carried out in a continuous relation. In the case of carrying out the pressurization in a continuous relation, the both pressurization steps will be absorbed as a single pressurization step. Typical examples thereof include the case where the gas pressure within the vacuum chamber 1 is raised to an extent exceeding the atmospheric pressure; and the case where the molten metal 4 is supplied onto the opening surface of the object 2 by an injection machine, and the molten metal is cooled and hardened while applying a forced external force due to its injection pressure. Indeed, even in the case where the pressurization steps are integrated as a single pressurization step, it is preferable that the application pressure is adjusted.

As described previously, since the present invention includes the hardening step of cooling the filled molten metal 41 within the fine space 21 and hardening it while applying the forced external force F1 to the molten metal 4 within the fine space 21, not only the filled molten metal 41 can be surely filled within the fine space 21, but when the filled molten metal 41 is heat shrunken in the process of cooling, the deformation of the metal to be caused due to the heat shrinkage can be suppressed by the applied forced external force F1. For that reason, it is possible to fill a hardened metal body 40 in the fine space 21 to an extent of its bottom without forming an air gap, a void, etc. For the same reason, the concaveness to be caused when the hardened metal body 40 is cooled within the fine space 21 can be avoided, too.

Furthermore, since the concaveness of the hardened metal body 40 within the fine space 21 can be avoided, the present invention does not require resupply of a molten metal after cooling, a CMP step, etc. and is able to contribute to simplification of steps, enhancement of a yield, etc.

In particular, in the casting step, in the case of supplying the molten metal 4 onto the outer surface of the object 2 such that the metal thin film 42 is formed, this metal thin film 42 receives a pressure to cause changes such as a change in the film thickness corresponding to the form of the filled molten metal 41 which is filled in the fine space 21. Accordingly, concaveness as well as deformation to be caused due to heat shrinkage of the hardened metal body 40 which is filled in the fine space 21 and hardened can be surely suppressed.

(D) Post Step:

Subsequently, the metal thin film 42 on the outer surface of the object 2 is remelted, and the remelted metal thin film 42 is wiped off by, for example, a squeeze 5, etc. According to this post step, the outer surface of the object 2 can be flattened. Moreover, a simple operation as wiping off may be enough, and different from the conventional technologies, resupply of a molten metal 4 after cooling of the molten metal, a CMP step, etc. is not necessary. Therefore, the present invention is able to contribute to simplification of steps, enhancement of a yield, etc. In desired, a step of undergoing repressurization F2 and subsequent cooling may also be carried out in conformity with the hardening step. Indeed, since this post step is carried out for the purposes of removing the metal thin film 42 and flattening one surface of the object 2, in the case where flattening is not necessary, the post step can be omitted. Furthermore, it may be possible to remove the hardened metal thin film 42 by means of polishing or the like, without remelting the hadened metal thin film 42.

The heat at the time of remelting is also applied to the hardened metal body 40 which is hardened in the inside of the fine space 21, but the heat capacity of the hardened metal body 40 is remarkably larger than the heat capacity of the metal thin film 42. Accordingly, even when the metal thin film 42 is remelted, the development of remelting of the hardened metal body 40 doe not occur. For that reason, only the metal thin film 42 can be wiped off.

By undergoing the foregoing series of steps, the object 2 having the hardened metal body 40 filled in the fine space 21 is obtained. It is not always necessary that all of the foregoing respective steps are carried out within the vacuum chamber 1. The hardening step and the post step include a step which may be carried out outside the vacuum chamber 1.

Figure 2:
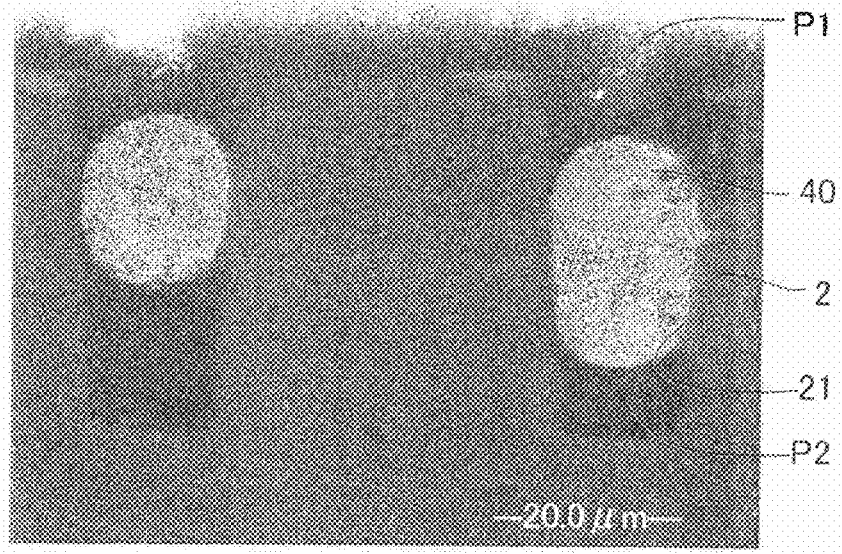
FIG. 2 is a cross-sectional SEM photograph of a semiconductor wafer (silicon wafer) obtained by omitting a hardening step (pressurization and cooling) in the steps shown in FIG. 1.
Figure 3:
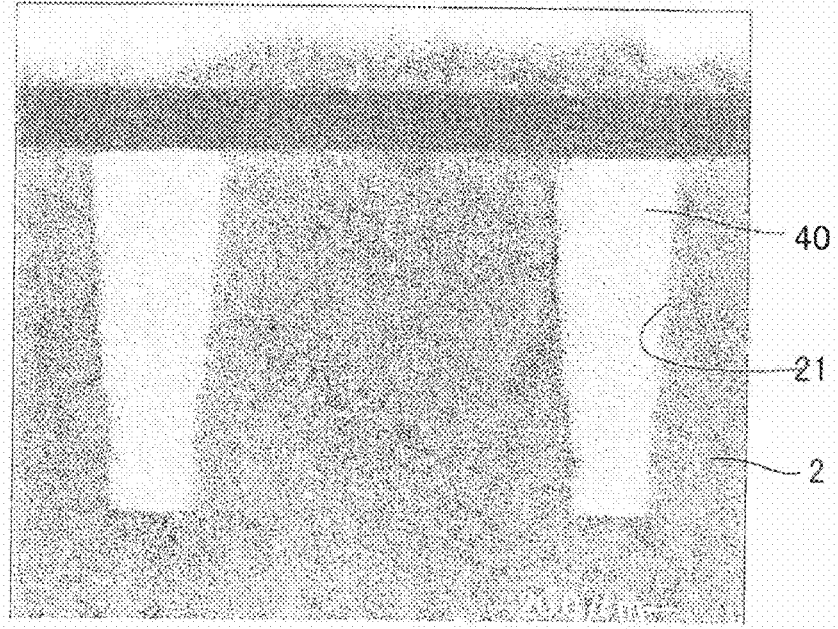
FIG. 3 is a cross-sectional SEM photograph of a semiconductor wafer (silicon wafer) obtained by a method according to the present invention including a hardening step (pressurization and cooling).

Next, the effects of the present invention are proven by SEM (scanning electron microscope) photographs. FIG. 2 is a cross-sectional SEM photograph of a semiconductor wafer (silicon wafer) obtained by omitting the hardening step (pressurization and cooling) in the steps shown in FIG. 1; and FIG. 3 is a cross-sectional SEM photograph of a semiconductor wafer (silicon wafer) obtained by the method according to the present invention including the hardening step (pressurization and cooling). The both SEM photographs show a cross section of a semiconductor wafer obtained under the same step conditions, except for the presence or absence of the hardening step (pressurization and cooling). The step conditions are as follows.

(A) Preparation Step:
  Degree of vacuum in vacuum chamber: $10^{-3}$ (Pa)
  Object: Silicon wafer of 300 mm×50 µm having a glass protective film
  Fine space: Opening size, 15 µm; hole size of the bottom, 10 µm
(B) Casting Step:
  (1) On the foregoing silicon wafer, a metal thin plate having the same shape was disposed and melted.
  Composition component of metal thin film: Sn, In, Cu and Bi
  Melting temperature: 250° C.
  (2) Subsequently, an $N_2$ gas was introduced into the vacuum chamber, thereby setting up the gas pressure at 0.6 kgf/cm$^2$ (pressurization).
(C) Hardening Step (Only in the Case of the Present Invention):
  A pressure of 2.0 kgf/cm$^2$ was applied to the molten metal by a pressing machine, and gradual cooling was carried out in that state.
(D) Post Step:
  Melting temperature for remelting: 250° C.
  Wiping off by squeeze
  Repressurization: A pressure of 2.0 kgf/cm$^2$ was applied by a pressing machine.

First of all, when the SEM photograph of FIG. 2 is viewed, a concave P1 is formed on the upper end side of the hardened metal body 40 filled in the inside of the fine space 21 of the wafer 2 as an object, and an air gap P2 not filled with the hardened metal body 40 is formed in the bottom thereof. The presence of an air gap is also observed between the surrounding of the hardened metal body 40 and the inner surface of the fine space 21.

On the other hand, when the SEM photograph of FIG. 3 according to the application of the present invention is viewed, the upper end surface of the hardened metal body 40 filled in the inside of the fine space 21 of the wafer 2 forms a flat surface continuously connecting with the upper surface of the wafer 2, and no concave is observed. The lower end surface of the hardened metal body 40 comes into close contact with the bottom of the fine space 21, and no air gap is observed in the bottom. Furthermore, the peripheral surface of the hardened metal body 40 comes into close contact with the inner surface of the fine space 21, and the presence of an air gap is not observed.

Figure 4:
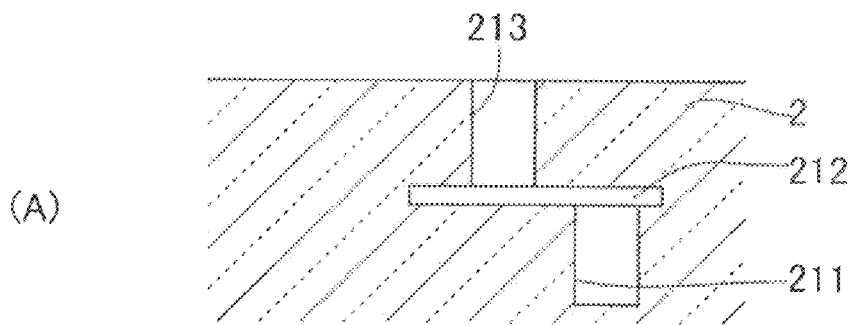
FIGS. 4A and 4B are each a view showing another application example of a method according to the present invention.
Figure 4:
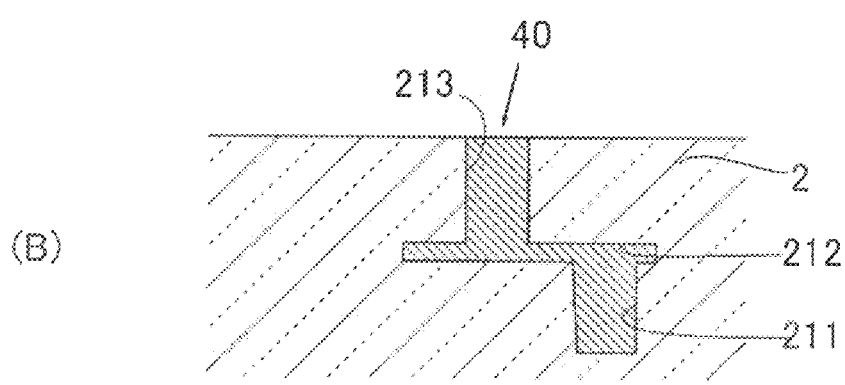

FIGS. 4A and 4B each shows another application example of the method according to the present invention. This example demonstrates that the present invention is applicable to not only a fine space having a linear simple structure but a fine space having a curved passage. Referring to 4A is made by reference, the object 2 has two fine spaces 211 and 213 extending in the vertical direction at a different position from each other, and these fine spaces 211 and 213 are continued each other via a fine space 212 extending in the horizontal direction.

Even in a fine space structure illustrated in FIG. 4A, by applying the method according to the present invention which has been described with reference to FIG. 1, the hardened metal body 40 which is continued through the fine spaces 211, 212 and 213 can be formed as shown in FIG. 4B. Although the illustration is omitted, even in fine spaces having a more complicated shape, the hardened metal body 40 can be formed by the application of the present invention.

In FIGS. 4A and 4B, the object 2 can take a form made of a metal, an alloy, a metal oxide, a ceramic, a glass, a plastic or a complex material thereof, or a stack thereof. Furthermore, the external shape of the object 2 is not limited to a tabular form but can take an arbitrary shape. The illustrated form is also merely one example chosen for the sake of convenience of explanation.

Figure 5:
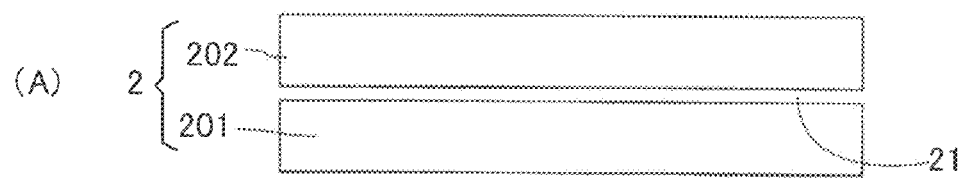
FIGS. 5A and 5B are each a view showing a still another application example of a method according to the present invention.
Figure 5:
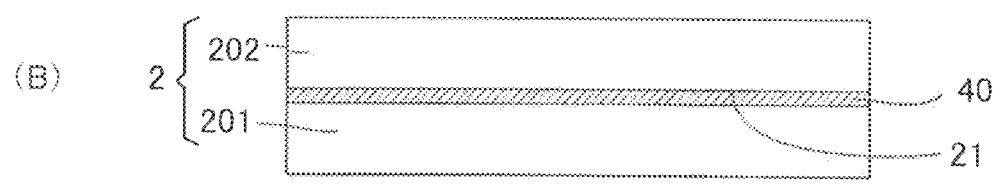

FIGS. 5A and 5B each shows a still another application example of the method according to the present invention. This example shows the case where the present invention is applied to the field of joining technologies. Referring to FIGS. 5A and 5B, the fine space 21 formed between a first member 201 and a second member 202 is filled with the hardened metal body 40. The hardened metal body 40 is one prepared by filling and hardening according to the method which has been described with reference to FIG. 1. The casting direction of the molten metal may be any of a direction orthogonal to the plane of the drawing or a direction parallel to the horizontal direction of the drawing. The shape of each of the first member 201 and the second member 202 is arbitrary, and the illustrated form merely shows one example. Also, the first member 201 and the second member 202 may be made of a metal material of the same kind or a different kind from each other.

The first member 201 and the second member 202 are in a non-separable relation. Even in the case where a welding technology such as general brazing cannot be applied, the both can be welded with each other by the application of the present invention.

Figure 6:
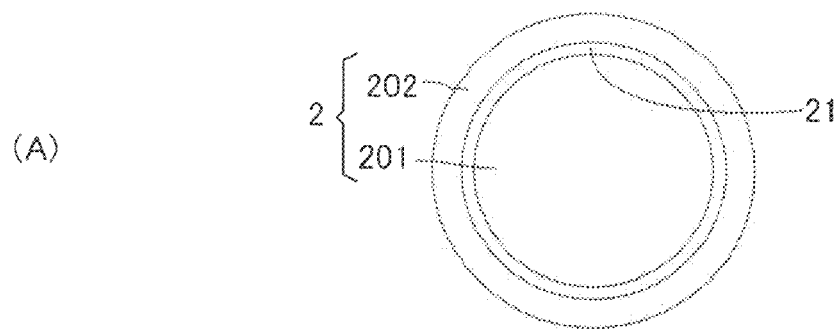
FIGS. 6A and 6B are each a view showing an even another application example of a method according to the present invention.
Figure 6:
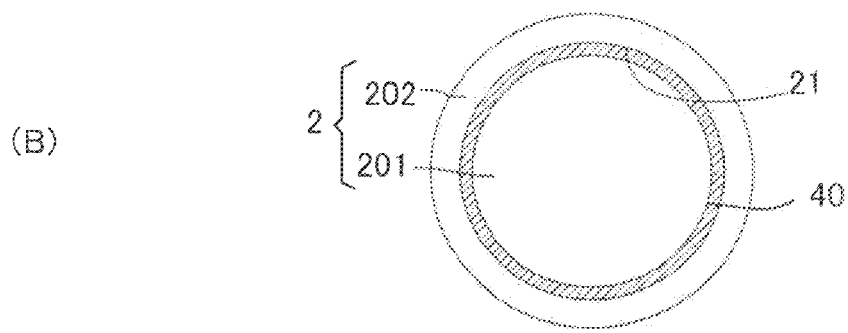

FIGS. 6A and 6B each shows an even another application example of a method according to the present invention. In this application example, the hardened metal body 40 is filled in the fine space 21 formed between two cylindrical bodies 201 and 202 disposed in a cylindrical state. Such an application scene can be generated in not only the technical field to which electronic devices or micromachines belong but the technical field of handling structural parts which are larger than those electronic devices or micromachines. That is, the application range of the present invention is not always limited to a manufacturing process of fine electronic devices or micromachines. Although the illustration is omitted, there is a possibility that the present invention is applied as a measure for filling a crack or a gap formed in the body.

The present invention has been described in detail above with reference to preferred embodiments. However, obviously those skilled in the art could easily devise various modifications of the invention based on the technical concepts underlying the invention and teachings disclosed herein.

What is claimed is:

1. A method for filling a molten metal in fine holes present in a wafer and hardening the molten metal so the fine holes of the wafer are filled with the metal, comprising:
    cooling and hardening the molten metal while applying a forced external force exceeding atmospheric pressure to the molten metal within the fine holes after filling the fine holes with the molten metal,
    wherein one end of the fine holes is opened on an outer surface of the wafer and an other end of the fine holes is closed; and
    the forced external force is a mechanical force directly applied to the molten metal from an opening surface side on which the fine holes are opened.

2. The method according to claim 1, further comprising:
    before the cooling and hardening step, disposing a metal thin plate on the opening surface side and melting the metal thin plate in a reduced pressure atmosphere within a vacuum chamber to form the molten metal.

3. The method according to claim 2, further comprising:
    before the cooling and hardening step, raising the pressure of the atmosphere within the vacuum chamber from the reduced pressure state and casting the molten metal into the fine holes.

4. The method according to claim 1, further comprising:
    before the cooling and hardening step, supplying the molten metal onto the opening surface side of the wafer placed in a reduced pressure atmosphere within a vacuum chamber; and
    after the supplying step, raising the pressure of the atmosphere within the vacuum chamber.

5. The method according to claim 1, wherein the molten metal is supplied such that a metal thin film is formed on the opening surface side.

6. The method according to claim 5, further comprising:
    after hardening the molten metal, remelting the metal thin film on the opening surface side and wiping off the remelted metal thin film.

7. The method according to claim 5, wherein the thin film is formed when a volume of the molten metal is larger than a volume of the fine holes.

8. The method according to claim 1, wherein the mechanical force directly applied to the molten metal is a pressing pressure applied by a pressing plate.

9. The method according to claim 8, wherein the pressing plate is applied via one of an air pressure and an oil pressure.

10. The method according to claim 1, wherein the mechanical force directly applied to the molten metal is gas pressure of a vacuum chamber applied by a pressing plate that receives the gas pressure.

11. The method according to claim 1, wherein
    the fine holes are through holes which extend through the wafer, and
    the other end of the fine holes is closed by a support tool on which the wafer is set.

12. the method according to claim 1, wherein
    the fine holes have a diameter of not more than 60 μm.

* * * * *